(12) United States Patent
Zhe

(10) Patent No.: US 7,436,054 B2
(45) Date of Patent: Oct. 14, 2008

(54) MEMS MICROPHONE WITH A STACKED PCB PACKAGE AND METHOD OF PRODUCING THE SAME

(75) Inventor: Wang Zhe, Singapore (SG)

(73) Assignee: Silicon Matrix, Pte. Ltd., Singapore (SG)

( * ) Notice: Subject to any disclaimer, the term of this patent is extended or adjusted under 35 U.S.C. 154(b) by 421 days.

(21) Appl. No.: 11/368,172

(22) Filed: Mar. 3, 2006

(65) Prior Publication Data

US 2007/0205492 A1    Sep. 6, 2007

(51) Int. Cl.
*H01L 23/02* (2006.01)

(52) U.S. Cl. .............................. 257/686; 257/E23.003; 438/51

(58) Field of Classification Search .......... 257/E23.003; 438/51
See application file for complete search history.

(56) References Cited

U.S. PATENT DOCUMENTS

| | | | |
|---|---|---|---|
| 6,781,231 | B2 | 8/2004 | Minervini |
| 7,202,552 | B2 * | 4/2007 | Zhe et al. ..................... 257/659 |
| 2002/0102004 | A1 | 8/2002 | Minervini |
| 2007/0013052 | A1 * | 1/2007 | Zhe et al. ..................... 257/704 |
| 2007/0040231 | A1 * | 2/2007 | Harney et al. ............... 257/415 |

OTHER PUBLICATIONS

Co-pending U.S. Patent App. AL-05-001, U.S. Appl. No. 11/182,254, filed Jul. 15, 2005, "A MEMS Package Using Flexible Substrates, and Method Thereof", assigned to the same assignee as the present invention.
Co-pending U.S. Patent App. AL-05-005, U.S. Appl. No. 11/333,579, filed Jan. 17, 2006, "A MEMS Packaging Method for Enhanced EMI Immunity Using Flexible Substrates", assigned to the same assignee as the present invention.

* cited by examiner

*Primary Examiner*—Trung Dang
(74) *Attorney, Agent, or Firm*—Saile Ackerman LLC; Stephen B. Ackerman; Rosemary L. S. Pike

(57) ABSTRACT

A MEMS microphone with a stacked PCB package is described. The MEMS package has at least one MEMS acoustic sensor device located on a PCB stack. A metal cap structure surrounds the at least one MEMS acoustic sensor device wherein an edge surface of the metal cap structure is attached and electrically connected to the PCB stack. In a first embodiment, a back chamber is formed underlying the at least one MEMS acoustic sensor device and within the PCB stack wherein an opening underlying the at least one MEMS acoustic sensor device accesses the back chamber. An opening in the metal cap structure not aligned with the at least one MEMS acoustic sensor device allows external fluid, acoustic energy or pressure to enter the at least one MEMS acoustic sensor device. In a second embodiment, a back chamber is formed in the space under the metal cap and over the first PCB. A hollow chamber is formed between the first PCB and the second PCB wherein an opening under the at least one MEMS acoustic sensor device accesses the hollow chamber. An opening in a bottom surface of the PCB stack not aligned with the at least one MEMS acoustic sensor device also accesses the hollow chamber and allows external fluid, acoustic energy or pressure to enter the at least one MEMS acoustic sensor device.

25 Claims, 4 Drawing Sheets

MEMS MICROPHONE WITH A STACKED PCB PACKAGE AND METHOD OF PRODUCING THE SAME

BACKGROUND OF THE INVENTION (1) Field of the Invention

The invention relates to processes for packaging a MEMS microphone, and MEMS packages produced using the method, and more particularly, to a method of packaging a MEMS microphone having good environmental protection and a sufficient back chamber.

(2) Description of the Related Art

Micro-electro-mechanical systems (MEMS) devices are known which convert physical phenomena, such as pressure, acceleration, sound, or light, into electrical signals. Each type of MEMS device interacts with the world in a different way, and demands custom or at least semi-custom packaging solutions. So-called system-in-package techniques attempt to form an entire microsystem—which could include a microprocessor, communications components, actuators and sensors—within a single package. However, packaging of a MEMS device is totally different from packaging an integrated circuit. MEMS devices are categorically different from ICs despite sharing some fundamental processing technologies. Packaging is the biggest challenge for commercializing most MEMS devices. The term "MEMS package" is used in this document to imply a package including at least one MEMS device.

The packaging requirements of a MEMS microphone or acoustic sensor are complex because the devices need to have an open path to receive sound pressure and yet the devices need to be protected from external environmental hazards like particles, dust, corrosive gases and humidity. In addition, the device must have a back chamber to be functional. A sufficient back chamber is an essential requirement to guarantee the desired performance of any microphone/acoustic sensor. An insufficient back chamber will damp the diaphragm movement and increase the acoustic noise. In considerations of packaging the MEMS microphone, it is also desired to avoid expensive substrate and packaging materials.

For example, FIG. 1A illustrates a low cost package concept. The MEMS microphone/acoustic sensor 102 is mounted on a low cost 2-layer PCB substrate 100. A metal lid 104 has an opening 105. The opening 105 away from the MEMS device can avoid any direct impact from environmental hazards and thus provides a good environmental package protection. However, there is an insufficient back chamber behind the MEMS microphone/acoustic sensor. FIG. 1B illustrates another low cost package concept with a 2-layer PCB and a metal lid 104. The space enclosed by the metal lid and the PCB substrate provides a sufficient back chamber. However, the opening 105 under the MEMS microphone/acoustic sensor 102 directly exposes the diaphragm to external environments, making it susceptible to external hazards.

Some prior art patents have attempted to address these concerns. U.S. Pat. No. 6,781,231 to Minervini describes a method of packaging a MEMS microphone into a house formed by a substrate having at least one conductive layer and a conductive cap. However, this provides an insufficient back chamber, similar to the packaging concept illustrated in FIG. 1A.

U.S. patent application Ser. No. 2002/0102004 A1 to Minervini discloses a MEMS microphone package including an expensive multi-layer PCB to create the required back chamber under the MEMS sensing element.

Co-pending U.S. patent application (AL05-001) Ser. No. 11/182254, filed on Jul. 15, 2005, teaches the methods of using flexible substrates and folding processes to make MEMS packages. However, the MEMS die may be exposed to external environmental hazards using this method. Co-pending U.S. patent application (AL05-005) Ser. No. 11/333579, filed on Jan. 17, 2006, discloses the use of a metal meshed hole for environmental protection, but the flexible substrate and processing costs are still high.

SUMMARY OF THE INVENTION

A principal object of the present invention is to provide a cost-effective and very manufacturable method of producing a MEMS package incorporating a MEMS acoustic sensing device and one or more other electronic circuits.

Another object of the invention is to provide a MEMS microphone package.

Yet another object of the invention is to provide a method of producing a MEMS microphone with a stacked PCB package.

A further object of the invention is to provide a MEMS microphone with a stacked PCB package.

In accordance with the objects of this invention a MEMS microphone with a stacked PCB package is achieved. The MEMS package has at least one MEMS acoustic sensor device and one or more electronic components located on a PCB stack. A metal cap structure surrounds the at least one MEMS acoustic sensor device and one or more electronic components wherein an edge surface of the metal cap structure is attached and electrically connected to the PCB stack wherein an opening in the metal cap structure is not aligned with the at least one MEMS acoustic sensor device and wherein the opening allows external fluid, acoustic energy or pressure to enter the at least one MEMS acoustic sensor device. A back chamber is formed underlying the at least one MEMS acoustic sensor device and within the PCB stack wherein an opening underlying the at least one MEMS acoustic sensor device accesses the back chamber.

Also in accordance with the objects of this invention, another MEMS microphone with a stacked PCB package is achieved. The MEMS package has a PCB stack on a top surface of which at least one MEMS acoustic sensor device and one or more electronic components are mounted. A metal cap structure surrounds the at least one MEMS acoustic sensor device and one or more electronic components wherein an edge surface of the metal cap structure is attached and electrically connected to the PCB stack. A back chamber is formed under the metal cap and over the first PCB. A hollow chamber is formed within the PCB stack wherein an opening underlying the at least one MEMS acoustic sensor device accesses the hollow chamber and wherein an opening in a bottom surface of the PCB stack also accesses the hollow chamber wherein the opening in the bottom surface of the PCB stack is not aligned with the at least one MEMS acoustic sensor device and wherein the opening allows external fluid, acoustic energy or pressure to enter the at least one MEMS acoustic sensor device.

Also in accordance with the objects of this invention a method of producing a MEMS microphone with a stacked PCB package is achieved. A MEMS acoustic sensor device and one or more electronic components are mounted on a top surface of a first PCB. A metal cap structure is mounted on the top surface of the first PCB and encapsulating the MEMS acoustic sensor device and one or more electronic components. A second PCB is mounted on a bottom surface of the first PCB wherein a hollow chamber is formed between the first PCB and the second PCB and wherein an opening underlying the MEMS acoustic sensor device accesses the hollow chamber to complete fabrication of a MEMS acoustic sensor device in a stacked PCB package. In a first embodiment, the hollow chamber forms a back chamber for the MEMS acoustic sensor device and an opening in the metal cap structure not aligned with the MEMS acoustic sensor device allows external fluid, acoustic energy or pressure to enter the MEMS acoustic sensor device. In a second embodiment, a back chamber is formed within a space bounded by the metal cap and the first PCB. An opening in the bottom surface of the second PCB to the hollow chamber, not aligned with the MEMS acoustic sensor device, allows external fluid, acoustic energy or pressure to enter the MEMS acoustic sensor device.

BRIEF DESCRIPTION OF THE DRAWINGS

In the accompanying drawings forming a material part of this description, there is shown.

DESCRIPTION OF THE PREFERRED EMBODIMENTS

The present invention proposes a method for packaging a MEMS microphone or acoustic sensor device as well as one or more electronic components (typically, an application specific IC (ASIC) and one or more passive components) on a stacked PCB package. The present invention provides MEMS packages and a method of fabricating the MEMS packages that provide sufficient back chamber for the MEMS microphone and protection of the MEMS device from external environmental hazards while avoiding expensive substrate and packaging materials.

Figure 6:
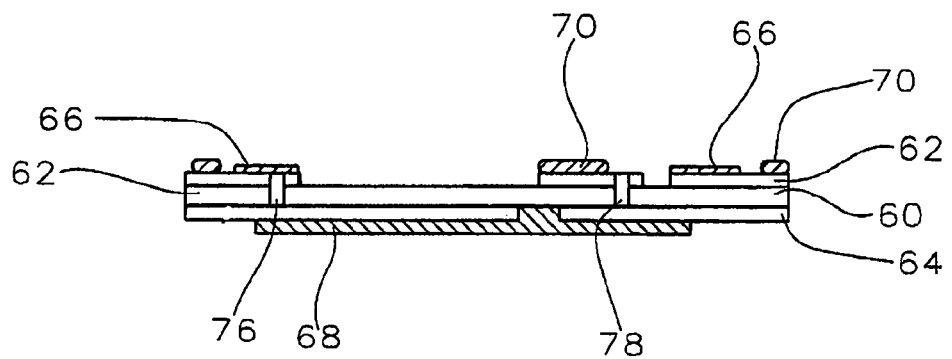
Figure 7:
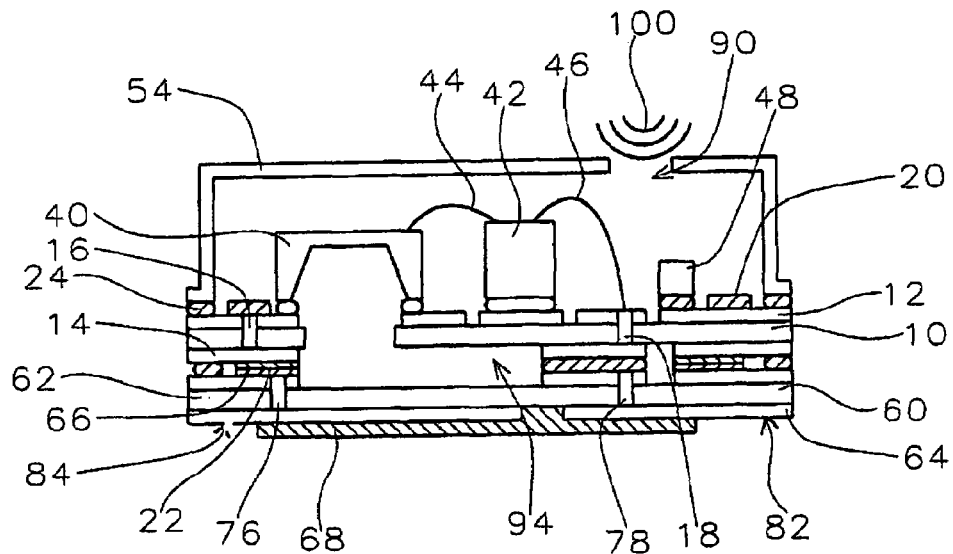
FIG. 7 schematically illustrates in cross-sectional representation the first preferred embodiment of the present invention.
Figure 8:
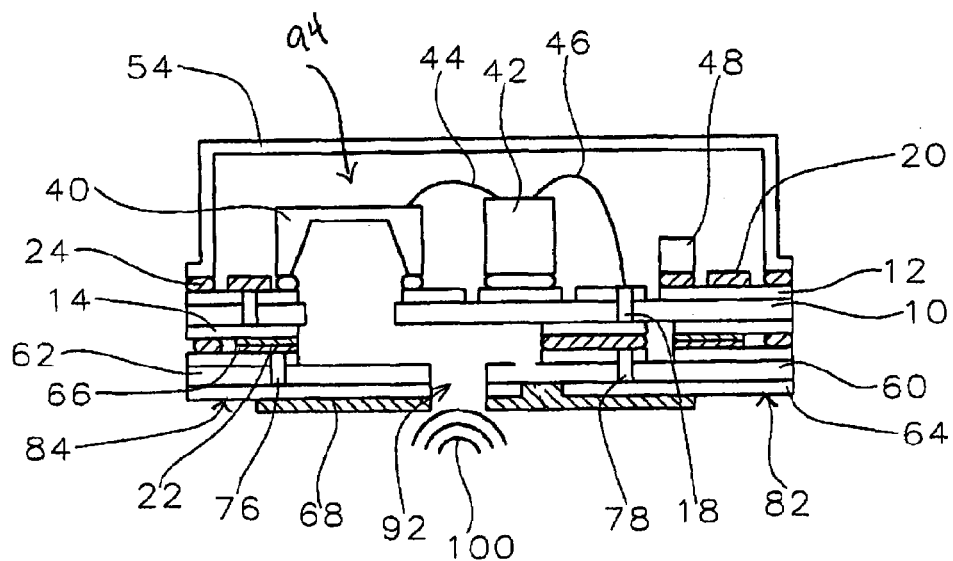
FIG. 8 schematically illustrates in cross-sectional representation the second preferred embodiment of the present invention.

A first preferred embodiment of the invention is illustrated in FIG. 7. A second preferred embodiment of the invention is illustrated in FIG. 8. A preferred method to fabricate either the first or the second embodiment of the invention is illustrated in FIGS. 2-6.

Figure 1A:
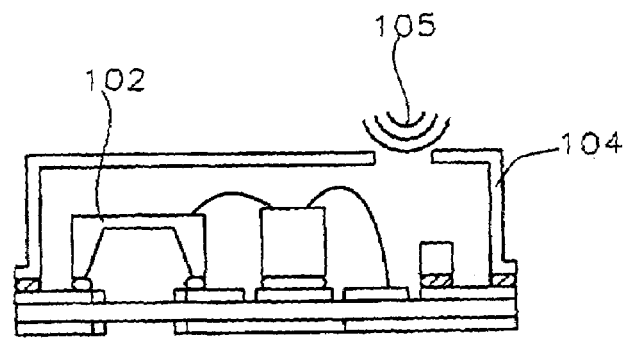
FIGS. 1A and 1B schematically illustrate in cross-sectional representation two MEMS package concepts of the prior art.
Figure 1B:
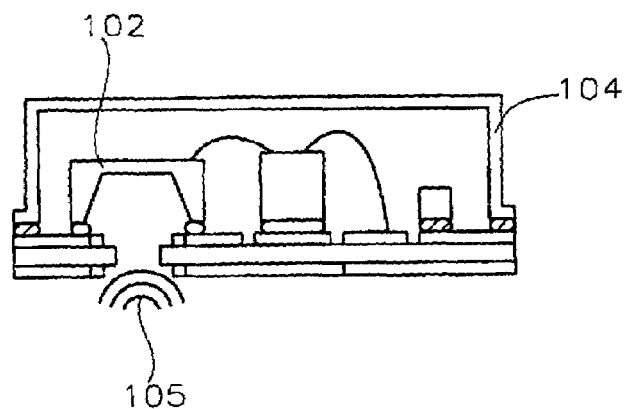
Figure 2:
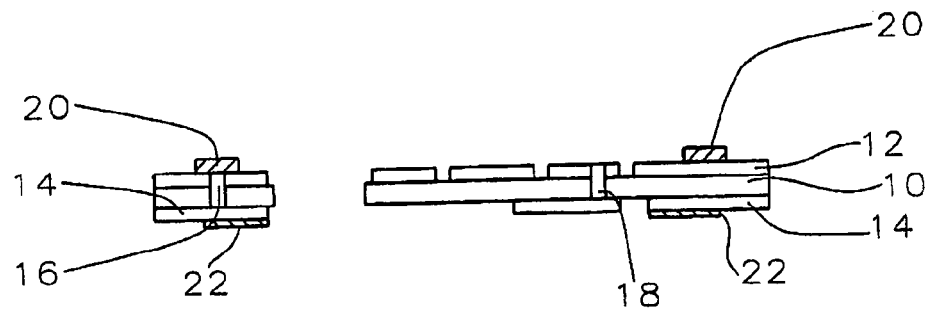
FIGS. 2 through 6 schematically illustrate in cross-sectional representation, processing steps in a method of producing the MEMS microphone package of the present invention.

The preferred embodiment of the invention will now be described with reference to FIGS. 2 through 6. Referring now more particularly to FIG. 2, there is illustrated a two-layer printed circuit board (PCB) 10. The core layer 10 may be FR4, FR5, or BT, which is laminated with Cu, for example. FR4 laminate is the usual base material from which plated-through-hole and multilayer printed circuit boards are constructed. "FR" means Flame Retardant, and Type "4" indicates woven glass reinforced epoxy resin. Top metal layer 12 and bottom metal layer 14 have been patterned as desired for the package. The PCB has an opening underlying the planned position of the MEMS microphone.

Metal layers 12 and 14 are preferably copper, having a metal surface finish for wirebonding. The copper layer is typically 25 µm in thickness, but can be more or less, depending on the application. The surface finish metal can be Ni/Au, where the nickel layer is about 3 µm thick and the overlying gold layer has a minimum thickness of about 0.35 µm. There are also solder resist layers 20 and 22 patterned on both sides of the PCB to cover the areas without wire-bonding, die-attaching or soldering.

The passive components, the MEMS devices and the IC devices are to be mounted onto the PCB. One MEMS microphone device 40, one integrated circuit device 42, and one passive device 48 are illustrated. It will be understood that the MEMS package of the invention comprises at least one MEMS microphone device, but that more than one MEMS device may be included. One or more electronic components, such as IC 42, typically, an application specific IC (ASIC) and one or more passive components such as a capacitor, resistor, inductor, or other passive device may be included in the package.

Figure 3:
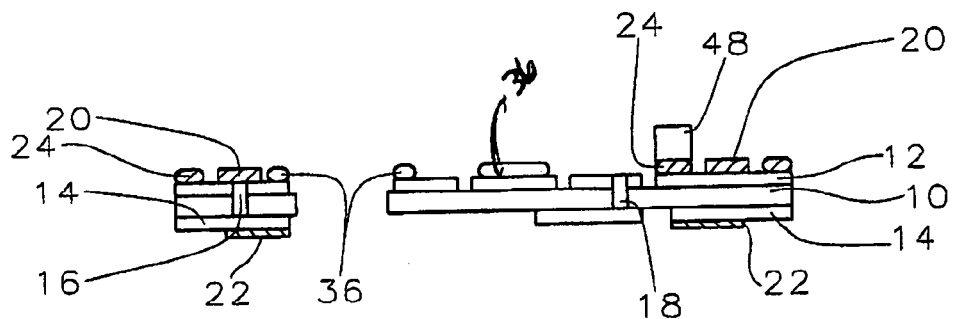

Referring now to FIG. 3, solder paste 24 is applied, such as by screen printing with a stencil. Any solder paste that is to be needed must be applied at this point prior to attaching the MEMS and IC devices. Thus, the solder paste to be used for attaching the metal cap must be applied at this time also. Any passive device 48 is attached to the PCB by a surface mounting technique (SMT), using the solder paste 24. Next, adhesive 36 is dispensed for die attachment. A low modulus adhesive would be preferred for stress relaxation such as a silicone-based adhesive.

Figure 4:
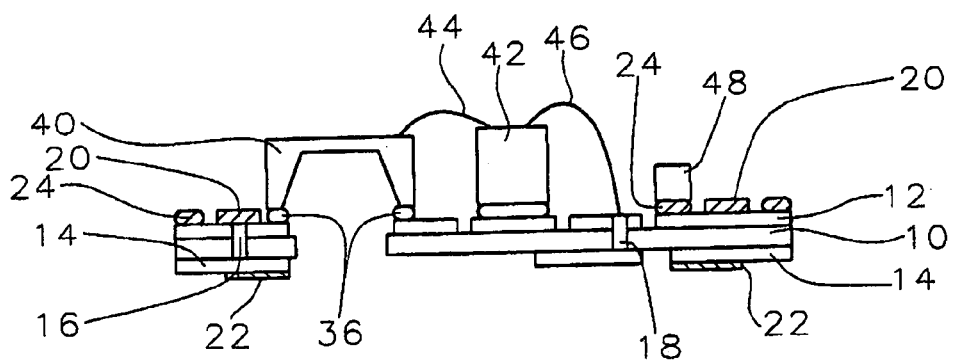

As illustrated in FIG. 4, the MEMS and ASIC dies are pick-n-placed onto the PCB. The MEMS microphone 40 and any other MEMS devices are attached to the PCB with the adhesive 36. Any IC device 42 is attached to the PCB 10 using adhesive 36 in a die-attach process. The IC device 42 is then wire-bonded by gold wires 44 and 46 to the MEMS device 40 and to a gold pad on the substrate, respectively.

Figure 5:
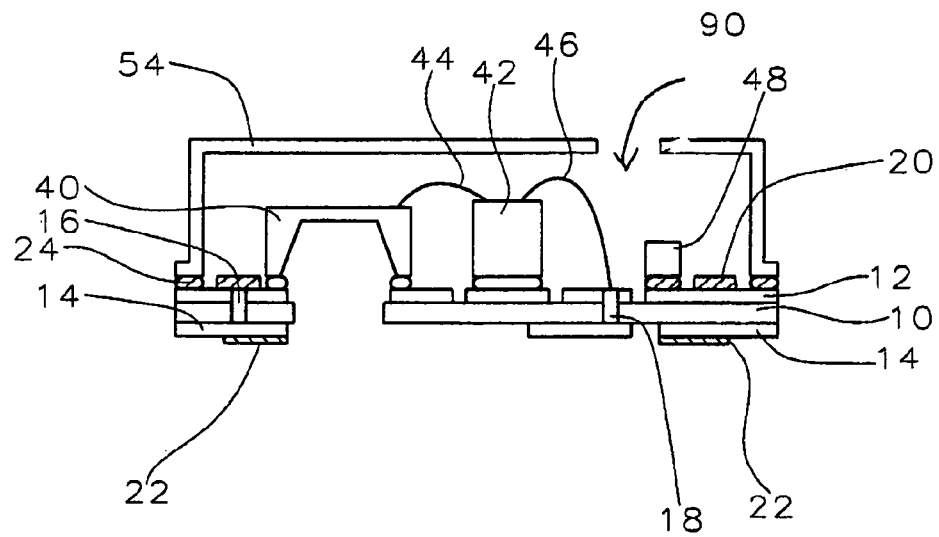

Next, a metal cap 54 is to be placed, as shown in FIG. 5. The metal cap may comprise copper, a copper alloy, an aluminum alloy, an iron alloy with solderable metal finish, a plastic with a metal finish formed by either electroless plating or painting, or a conductive composite formed by either injection molding or transfer molding. The edges of the metal cap are dipped into solder flux and attached to the PCB by reflowing the solder 24, which has been formed previously. Alternatively, the metal cap can be attached to the PCB by any conductive adhesive. The metal cap encapsulates all the devices on the PCB and is electrically connected to the PCB. The metal cap of the first embodiment has an opening 90, as shown in FIGS. 5 and 7. The metal cap of the second embodiment of the invention does not have an opening in it, as shown in FIG. 8.

This completes assembly of the first PCB. Now, a second two-layer PCB 60 is shown in FIG. 6. Solder paste 70 is applied to the second PCB by screen printing, for example. The first and second PCB's are aligned and attached using a solder reflow process. Finally, the stacked PCB package is singulated into individual package units. Alternatively, the PCB stack can be made first, followed by mounting the MEMS device and other components and attaching the metal cap to the stacked PCB.

FIG. 7 illustrates the completed MEMS microphone package of the first preferred embodiment of the invention. The MEMS microphone 40, IC 42, and passive device 48 are mounted on the stacked PCB's 10 and 60 and encapsulated by the metal cap 54. Signal/power vias 18 and 78, signal/power pads 82, ground vias 16 and 76, and ground pads 84 are illustrated. The stacked PCB's form the back chamber 94 for the MEMS microphone 40. External fluid, acoustic energy or pressure 100 enters the package through opening 90 in the metal cap. The opening is not aligned with the MEMS microphone device so that the MEMS device is protected from external environmental hazards. The back chamber is sufficient to allow diaphragm movement and to minimize acoustic noise.

FIG. 8 illustrates the completed MEMS microphone package of the second preferred embodiment of the invention. Both preferred embodiments are fabricated according to the above-described method of the invention. The MEMS microphone 40, IC 42, and passive device 48 are mounted on the stacked PCB's 10 and 60 and encapsulated by the metal cap 54. Signal/power vias 18 and 78, signal/power pads 82, ground vias 16 and 76, and ground pads 84 are illustrated. The stacked PCB's form a hollow chamber. In this embodiment, the back chamber 94 is located within the space enclosed by the metal cap 54 and the first PCB 10. External fluid, acoustic energy or pressure 100 enters the package through opening 92 in the second PCB 60. The opening is not aligned with the MEMS microphone device so that the MEMS device is protected from external environmental hazards. The back chamber is sufficient to allow diaphragm movement and to minimize acoustic noise.

The present invention provides a MEMS microphone with a stacked PCB package and a method of manufacturing these packages. The MEMS microphone package of the invention provides sufficient back chamber for the microphone while protecting the MEMS element from external environmental hazards and avoiding expensive substrate and packaging materials.

While the invention has been particularly shown and described with reference to the preferred embodiments thereof, it will be understood by those skilled in the art that various changes in form and details may be made without departing from the spirit and scope of the invention.

What is claimed is:

1. A MEMS package comprising:
   at least one MEMS acoustic sensor device;
   a PCB stack on which said at least one MEMS acoustic sensor device and one or more electronic components are mounted;
   a metal cap structure surrounding said at least one MEMS acoustic sensor device and said one or more electronic components wherein an edge surface of said metal cap structure is attached and electrically connected to said PCB stack wherein an opening in said metal cap structure is not aligned with said at least one MEMS acoustic sensor device and wherein said opening allows external fluid, acoustic energy or pressure to enter said at least one MEMS acoustic sensor device; and
   a back chamber formed underlying said at least one MEMS acoustic sensor device and within said PCB stack wherein an opening underlying said at least one MEMS acoustic sensor device accesses said back chamber.

2. The package according to claim 1 wherein said PCB stack comprises a first PCB and a second PCB.

3. The package according to claim 2 wherein said first PCB and said second PCB each comprise patterned metal layers and solder resist layers on top and bottom sides.

4. The package according to claim 1 wherein said metal cap structure comprises a copper, a copper alloy, an aluminum alloy, an iron alloy with solderable metal finish, a plastic with a metal finish formed by either electroless plating or painting, or a conductive composite material formed by either injection molding or transfer molding.

5. The package according to claim 2 wherein said first and second PCB's are attached by a soldering process.

6. The package according to claim 1 wherein said one or more electronic components comprise at least one integrated circuit and may comprise one or more passive components.

7. The package according to claim 6 further comprising wire bonding connections among said one or more electronic components, said at least one MEMS acoustic sensor device, and said PCB stack.

8. A MEMS package comprising:
   at least one MEMS acoustic sensor device and one or more electronic components;
   a PCB stack on a top surface of which said at least one MEMS acoustic sensor device and said one or more electronic components are mounted;
   a metal cap structure surrounding said at least one MEMS acoustic sensor device and said one or more electronic components wherein an edge surface of said metal cap structure is attached and electrically connected to said PCB stack; and
   a back chamber formed within said metal cap above said at least one MEMS acoustic sensor device and said top surface of said PCB stack wherein an opening underlying said at least one MEMS acoustic sensor device accesses a hollow chamber within said PCB stack and wherein an opening in a bottom surface of said PCB stack is not aligned with said at least one MEMS acoustic sensor device and wherein said opening and said hollow chamber allow external fluid, acoustic energy or pressure to enter said at least one MEMS acoustic sensor device.

9. The package according to claim 8 wherein said PCB stack comprises a first PCB and a second PCB.

10. The package according to claim 9 wherein said first PCB and said second PCB each comprise metal layers on both sides.

11. The package according to claim 8 wherein said metal cap structure comprises a copper, a copper alloy, an aluminum alloy, an iron alloy with solderable metal finish, a plastic with a metal finish formed by either electroless plating or painting, or a conductive composite material formed by either injection molding or transfer molding.

12. The package according to claim 9 wherein said first and second PCB's are attached by a soldering process.

13. The package according to claim 8 wherein said one or more electronic components comprise at least one integrated circuit and may comprise one or more passive components.

14. The package according to claim 13 further comprising wire bonding connections among said one or more electronic components, said at least one MEMS acoustic sensor device, and said PCB stack.

15. A method for fabricating a MEMS acoustic sensor device in a stacked PCB package comprising:
   providing a first PCB;
   mounting said MEMS acoustic sensor device and one or more electronic components on a top surface of said first PCB;
   mounting a metal cap structure on said top surface of said first PCB and encapsulating said MEMS acoustic sensor device; and
   mounting a second PCB on a bottom surface of said first PCB wherein a hollow chamber is formed between said first PCB and said second PCB and wherein an opening underlying said MEMS acoustic sensor device accesses said hollow chamber to complete said fabricating said MEMS acoustic sensor device in said stacked PCB package.

16. The method according to claim 15 further comprising mounting at least one passive device to said top surface of said first PCB and within said metal cap structure using solder paste and surface mount technology.

17. The method according to claim 15 wherein said hollow chamber forms a back chamber for said MEMS acoustic sensor device and wherein an opening in said metal cap structure not aligned with said MEMS acoustic sensor device allows external fluid, acoustic energy or pressure to enter said MEMS acoustic sensor device.

18. The method according to claim 15 wherein a back chamber is formed within a space bounded by said metal cap and said first PCB and wherein an opening in said bottom surface of said second PCB to said hollow chamber, wherein said opening is not aligned with said MEMS acoustic sensor device, allows external fluid, acoustic energy or pressure to enter said MEMS acoustic sensor device.

19. The method according to claim 15 wherein said mounting said MEMS acoustic sensor device to said first PCB comprises applying adhesive to said MEMS acoustic sensor device and attaching said MEMS acoustic sensor device to said PCB by said adhesive.

20. The method according to claim 15 wherein said mounting said metal cap structure on said top surface of said first PCB comprises:
    screen printing solder paste on said top surface of said first PCB prior to said mounting said MEMS acoustic sensor device and one or more electronic components;
    dipping edges of said metal cap structure into solder flux; and
    attaching said metal cap structure to said solder paste on said first PCB using a solder reflow process.

21. The method according to claim 15 wherein said mounting said metal cap structure on said top surface of said first PCB comprises:
    dispensing any conductive adhesive on said top surface of said first PCB; and
    attaching said metal cap structure to said conductive adhesive on said first PCB.

22. The method according to claim 15 wherein said mounting said second PCB on said bottom surface of said first PCB comprises:
    screen printing solder paste on a top surface of said second PCB;
    aligning said first PCB and said second PCB; and
    attaching said first PCB to said second PCB using a solder reflow process.

23. The method according to claim 15 wherein said one or more electronic components comprise at least one integrated circuit device wherein said at least one integrated circuit device is mounted to said top surface of said first PCB and within said metal cap structure using an adhesive.

24. The method according to claim 23 further comprising wirebonding said at least one integrated circuit device to said first PCB and to said MEMS acoustic sensor device.

25. The method according to claim 15 after said mounting a second PCB on a bottom surface of said first PCB, further comprising singulating said stacked PCB package into individual package units.

\* \* \* \* \*